United States Patent [19]

Spairisano et al.

[11] Patent Number: 4,888,307

[45] Date of Patent: Dec. 19, 1989

[54] METHOD FOR MANUFACTURING PLASTIC ENCAPSULATED SEMICONDUCTOR DEVICES

[75] Inventors: Antonio P. Spairisano, Palermo; Marino Cellai, Agrate Brianza, both of Italy

[73] Assignee: SGS Microelettronica S.p.A., Catania, Italy

[21] Appl. No.: 90,142

[22] Filed: Aug. 27, 1987

[30] Foreign Application Priority Data

Aug. 27, 1986 [IT] Italy .................................. 6611 A/86
Mar. 23, 1987 [IT] Italy ............................... 19800 A/87

[51] Int. Cl.⁴ .................. H01L 21/60; H01L 21/449; H01L 21/603
[52] U.S. Cl. ...................................... 437/216; 29/848; 29/856; 174/52.2
[58] Field of Search ...................... 437/214, 216, 211; 174/52 PE, 52 H, 52 FP; 29/841, 848, 856

[56] References Cited

U.S. PATENT DOCUMENTS

| 3,606,673 | 9/1971 | Overman | 437/214 |
| 4,451,973 | 6/1984 | Tateno et al. | 437/214 |

FOREIGN PATENT DOCUMENTS

| 0057963 | 5/1979 | Japan | 437/211 |
| 0138845 | 10/1980 | Japan | 437/211 |
| 0138847 | 11/1980 | Japan | 437/211 |
| 0143054 | 11/1980 | Japan | 437/211 |
| 0164510 | 12/1981 | Japan . | |
| 0160129 | 9/1983 | Japan . | |
| 0065437 | 4/1984 | Japan | 437/211 |
| 0143334 | 8/1984 | Japan | 437/211 |
| 0143334 | 8/1984 | Japan . | |
| 0005529 | 1/1986 | Japan | 437/211 |
| 0091937 | 5/1986 | Japan | 437/211 |

OTHER PUBLICATIONS

Translation of Japanese Kokai Patent Publication No. 59-65437.
Hull, John J., "Transfer Molding Old Solution to New Problems", Insulation/Circuits, Oct. 1981, pp. 19–23.

Primary Examiner—Brian E. Hearn
Assistant Examiner—Beverly A. Pawlikowski
Attorney, Agent, or Firm—Birch, Stewart, Kolasch & Birch

[57] ABSTRACT

A method for correctly positioning a metallic plate supporting a semiconductor chip in a mold used for encapsulation, wherein according to a first solution, at least a pair of retractable locating pins are utilized together with a lead connected to the supporting plate. The ends of the locating pins are retracted in the final phase of encapsulation, from the surfaces of the plate, whereas in the initial phase they are in direct contact with the surfaces. According to a second solution, a pair of clamping pins are indirectly connected to the plate through the interposition of insulating thicknessings.

2 Claims, 6 Drawing Sheets

PRIOR ART

FIG. 1

PRIOR ART

METHOD FOR MANUFACTURING PLASTIC ENCAPSULATED SEMICONDUCTOR DEVICES

The present invention relates to a method for manufacturing plastic encapsulated and electrically insulated semiconductor devices, and to the devices obtained thereby. Some types of plastic encapsulated semiconductor devices, and in particular some types of power semiconductor devices, provide the presence of one or more semiconductor chips soldered to the flat portion of a metallic support (hereinafter referred to as "metallic plate") that, besides operating as an electrode (or terminal) of the device, also serves as heat transfering means towards an external heat sink on which the device is to be mounted. Considering the need to provide this external heat sink with both a sufficient heat transfer and a good electrical insulation, the said flat portion during the encapsulation needs to be covered by a thin and uniform layer of plastic on its surface destined to be overlapped on the heat sink. The metallic plate shall therefore be set in a correct and well calibrated position in the mold used to obtain the encapsulation, during the injection of the plastic and its setting in the mold.

A prior art solution provides that the correct position of the plate in the mold be assured by locators in the mold, on the one side referred to the plate leads extending from the cavity of the mold, and on the other side referred to suitable extensions of the plate, which are also extending from the cavity of the mold and that are cut off after the encapsulation.

This solution presents the drawback that the device insulation is missing in the areas (also called "hot horns") where the extensions are cut off.

A partial remedy of the aforesaid drawback has been brought in by the embodiment object of the European Patent EP 661888, that provides such a shape of the plastic housing as to present the position of the "hot horns" in not very accessible points, thus reducing, but not eliminating completely, the possibilities of short-circuiting.

According to another known solution, one end of the metallic plate is fixed to the mold by means of the plate leads extending from the mold, whereas the other end is fixed by means of locating pins provided in the mold itself. Upon completion of the encapsulation process the areas of the metallic plate previously in contact with the aforesaid pins during the process, remain uncovered and must be then covered by additional liquid thermosetting resin. However, this solution has the drawback of supporting higher costs due to the distribution of the liquid sealing plastic, the difficulties to control the distribution through automatic processes, and to determine the exact metering, since a possible overflow of liquid sealing plastic on the surface to be overlapped on the external radiator could jeopardize the flatness of the surface itself and therefore the good heat transfer. The purpose of the present invention is to overcome the aforesaid drawbacks.

To this purpose, the manufacturing method according to the present invention, referred to as an electrically insulated and plastic encapsulated semiconductor device, comprises:
 a semiconductor chip,
 a metallic plate serving both as an electrode and as a heat sink, the first surface of which is soldered to the semiconductor chip,
 a plastic encapsulating housing which gives rise to a thin and uniform plastic layer on the second surface of the metallic plate, and
 a lead connected to the metallic plate,
wherein during the encapsulation, the correct position of the metallic plate in the encapsulating mold is maintained by a pair of locating pins and by locators in the mold associated with said lead, and is characterized by the fact that the ends of the locating pins separated (retracted), during the final phase of encapsulation from the metallic surfaces of the plate, whereas in the initial phase they are directly connected to the said metallic surfaces or indirectly connected through insulating thicknessings.

According to a first preferred embodiment, the method is characterized by the fact that:
 the locating pins are retractable, and their ends, during encapsulation, are maintained in contact with the said metallic strip as long as the plastic is being introduced into the mold, but before the thermosetting plastic becomes set, they are withdrawn, while the injection of the encapsulating plastic continues until the space previously occupied by the pins is filled.

According to another preferred embodiment the manufacturing method is characterized by the fact that:
 before the encapsulation begins, one or more thermoplastic nails are respectively inserted into one or more holes provided in the metallic plate,
 the ends of said nails are successively so riveted as to fix the nails themselves to the metallic plate and to give prefixed shape and size to said ends;
 the spacing pins are fixed to the mold and during the encapsulation serves as locators for the ends of the aforesaid nails.

The features of the present invention will be apparent from the following description when taken in conjunction with the accompanying drawings, wherein.

Figure 1:
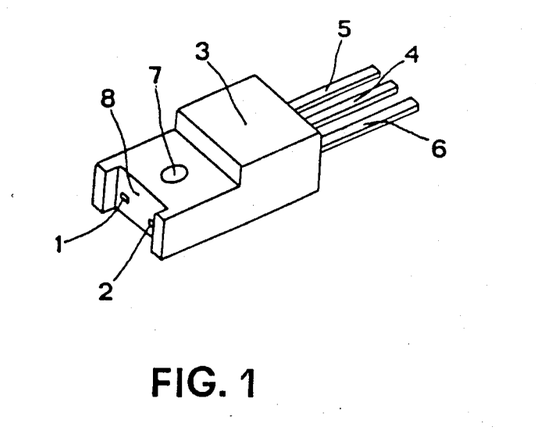
FIG. 1 shows a plastic encapsulated power transistor according to a known solution.

FIG. 1 is a perspective view of a known plastic encapsulated power transistor. The metallic pikes or "hot horns" 1 and 2 belong to a metallic plate encapsulated in the plastic together with a semiconductor chip, and are not covered by plastic housing 3. Leads 4, 5 and 6 extend out of housing 3; the transistor has to be fixed to a heat sink through a rivet or a screw passing through the electrically insulated hole 7 of the plastic housing 3. The voltage of such pikes 1 and 2 is the same as the transistor collector, which may be very high.

Figure 2:
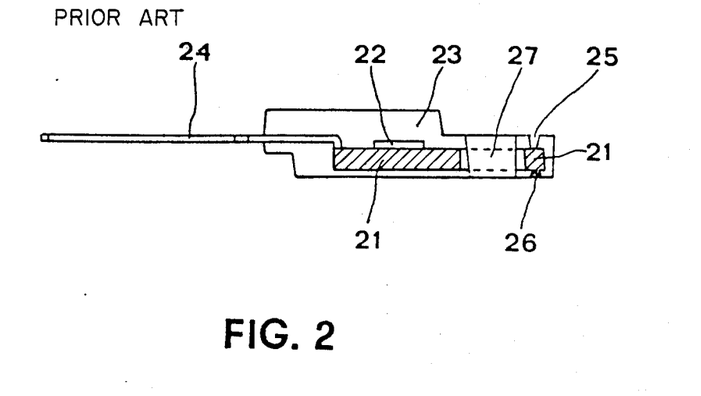
FIG. 2 shows a sectional view of a plastic encapsulated semiconductor device according to another known solution.

FIG. 2 shows a sectional view of a plastic encapsulated semiconductor device according to another prior art device, and in particular a metallic plate 21 on which is mounted a semiconductor chip 22 which is not fully encapsulated by the thermosetting plastic 23 used during the injection. In fact, during the injection into the mold, the thermosetting plastic does not fill cavities 25 and 26 of the plastic housing and does not cover the corresponding surfaces of both faces of the plate.

These cavities are created by the presence of supporting pins for positioning the plate in the mold and are subsequently filled with a liquid thermosetting plastic.

Figure 3:
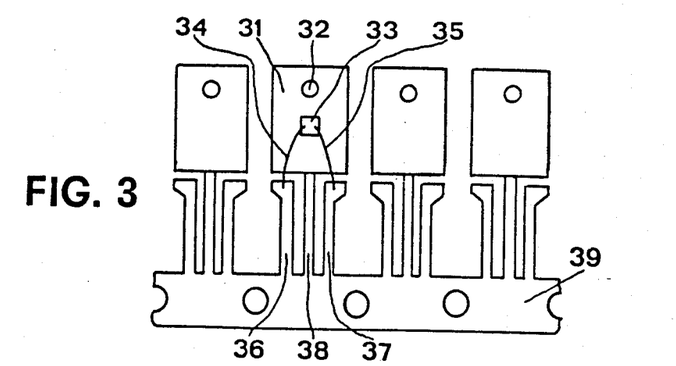
FIG. 3 is a plan view of a lead frame used in a first preferred embodiment of the present invention.

FIG. 3 shows a plan view of a lead frame used according to a first preferred embodiment of the present invention. A semiconductor chip 33 is mounted on one of these plates 31 and connected to leads 36, 37 respectively by means of wires 34, 35 and to the central lead 38 by way of the plate itself, the said lead 38 being tied thereto. All plates with relating leads are supported by strip 39 before the encapsulation into the plastic housing. The plates 31 are also provided with a hole 32 in plate 31 allowing, when installed, that the formed device can be fixed to an external heat sink. A plastic encapsulated semiconductor device, obtained through a frame as shown in FIG. 3, is illustrated in FIGS. 4 and 5.

Figure 4:
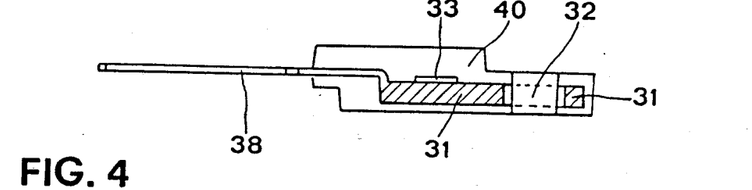
FIG. 4 is a sectional view of a plastic encapsulated semiconductor device utilizing the frame as shown in FIG. 3.
Figure 5:
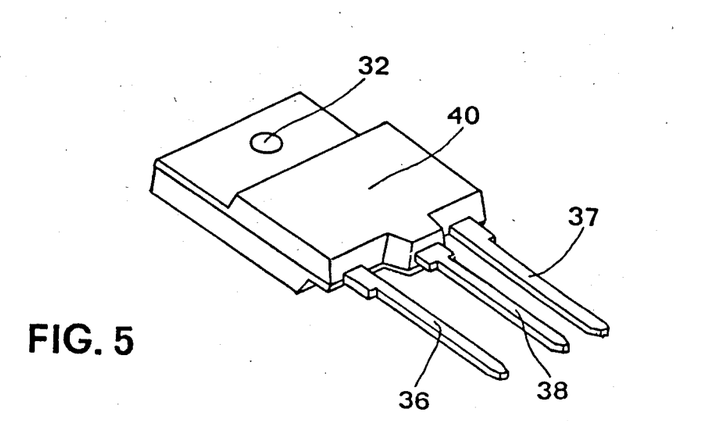
FIG. 5 is a perspective view of the semiconductor device as shown in FIG. 4.

FIG. 4 shows a plate 31 on which is mounted a semiconductor chip 33 which is fully encapsulated in a housing consisting of the same thermosetting plastic 40. It therefore provides a device which is electrically insulated according to the most severe international rules and does not present the drawbacks and limits of the prior art.

Figures 6A, 6B, 6C, 7:
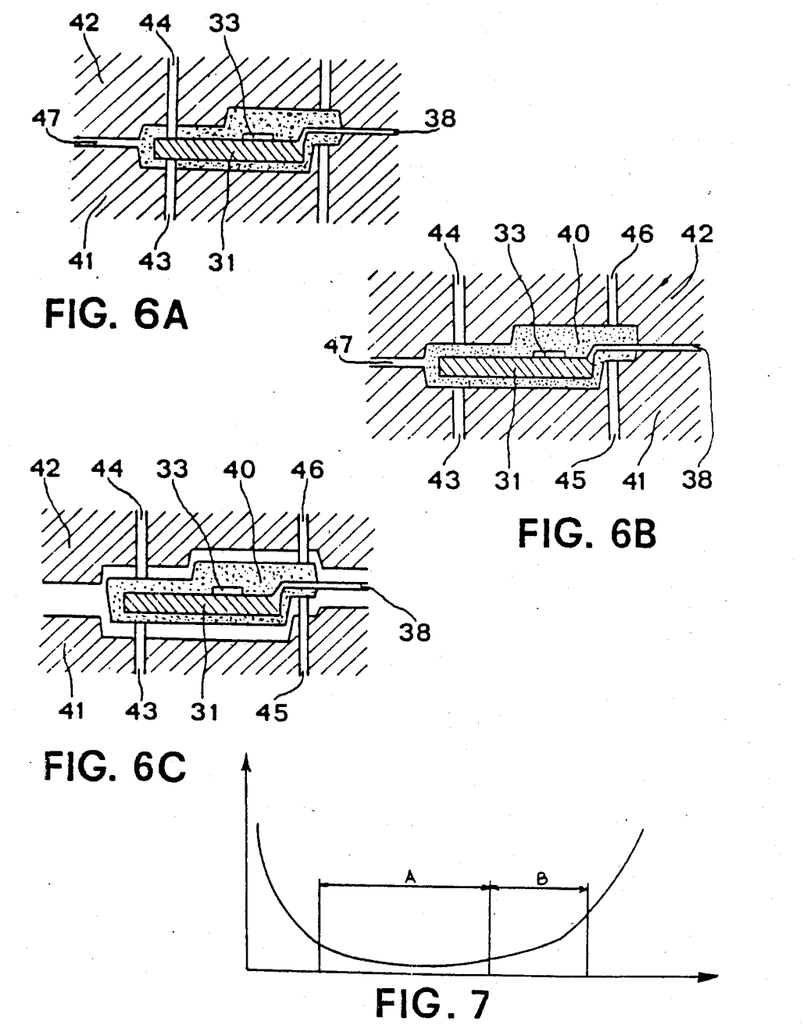
FIGS. 6A, 6B, 6C show in a diagramatic view a method for encapsulating a semiconductor device as shown in FIG. 4, during three phases of encapsulation.
FIG. 7 is a diagram relating to the thermosetting process of the encapsulating plastic as shown in FIGS. 6A and 6B.

With reference to FIGS. 6A, 6B, 6C which show a schematic view of part of the encapsulating equipment, the manufacturing process is described according to a first preferred embodiment of the present invention.

FIG. 6A shows a plate equipped with leads and located in a cavity of the mold, before and during the initial phase of plastic encapsulation. FIG. 6B shows it during the final phase of encapsulation with the fully encapsulated plastic housing. FIG. 6C shows the device according to the present invention during the removal of the encapsulated plate from the cavity of the mold of the transfer molding device.

FIG. 6A shows a plate 31 with a lead 38 tightly linked thereto, on which was previously assembled a semiconductor chip 33 connected to the leads by means of wires and located in the mold cavity of the transfer molding system. One side of the plate is clamped to a lead 38, and tightened between a lower section 41 and an upper section 42 of the mold, whereas the opposite side of the plate is tightened through the use of a lower and upper pair of retractable and lined-up ejector pins 43 and 44.

Thus, the plate has a correct and centered position inside the cavity of the mold. The plastic is of the thermosetting and electrically non conductive type. As shown in FIG. 6A, a fully closed plastic housing is not formed during the initial phase of the four retractile ejector pins 43 and 44. The ejector pins 43, 44 are withdrawn while the thermosetting reaction of the plastic begins; at the same time the plastic is continuosly injected under pressure, through channel 47, into the mold cavity and the thermosetting process is continued up to the complete thickness of the plastic.

Thus, (see FIG. 6B), the use of only one plastic material allows the obtainability of a fully closed plastic housing 40, which electrically insulates plate 31.

The manufacturing method of the device according to the present invention ends with the ejection of the plastic housing from the mold cavity. To this end, lower side 41 and upper side 42 of the mold are moved away from each other and the housing is detached from the mold cavity (see FIG. 6C) by the use of the ejector pins 43, 44 and of additional pairs the ejector pins 45, 46.

FIG. 7 better details the above described method. It illustrates a curve indicating the encapsulating plastic viscosity relative to time, for a prefixed mold temperature of the transfer molding system. FIG. 7, when taken in conjunction with FIGS. 6A and 6B, shows that, during the filling of the mold cavity (phase A), the plastic viscosity is very low, in order to make the flow easier. During phase A the plate is clamped by ejector pins 43, 44 in order to avoid its movement from the correct position due to injection under pressure of the liquid plastic. When the cavity mold is filled and the plate cannot move, as it is also supported by the plastic itself, which starts to polymerize, the withdrawal of the ejector pins 43, 44 (phase B) is initiated and so the consequent further filling with liquid plastic of the areas in the cavity previously occupied by ejector pins 43, 44 is completed.

Figure 8:
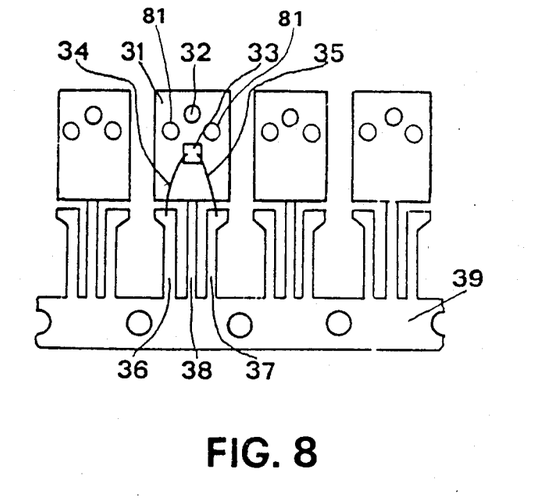
FIG. 8 is a plan view of a lead frame used in a second preferred embodiment of the present invention.

FIG. 8 shows the portion of the lead frame used in the second preferred embodiment of the present invention. In this figure, the function of the elements is the same as in FIG. 3, with the exception of holes 81 which, in this embodiment, are adapted to accomodate two thermosetting plastic insulating nails. The encapsulation method provides, according to this embodiment, that after the soldering of the semiconductor chip on each plate and after the connection of the metallized parts of the chip to the respective leads (similarly to the example of plate 31 of FIG. 3), two thermoplastic nails with prefixed shape and size are (automatically) inserted into the holes 81.

Figure 9:
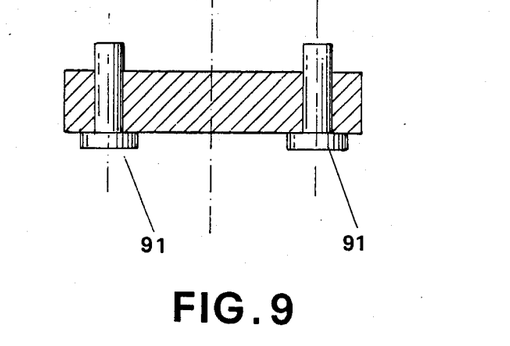
FIG. 9 is a sectional view of a metallic plate as shown in FIG. 8 after the nails have been inserted and before the riveting of their ends.
Figure 10:
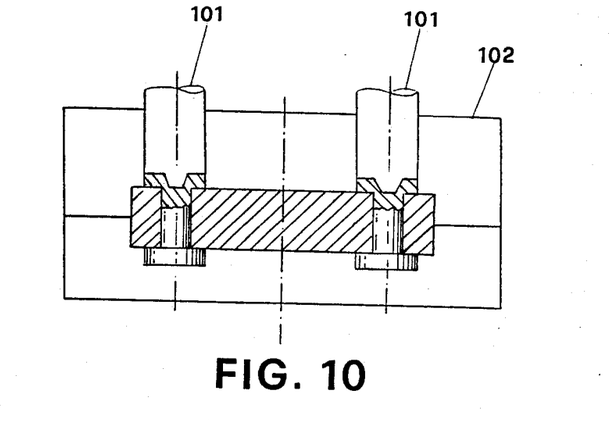
FIG. 10 is a sectional view of a metallic plate as shown in FIG. 9 after the riveting of the ends of the nails.
Figure 11:
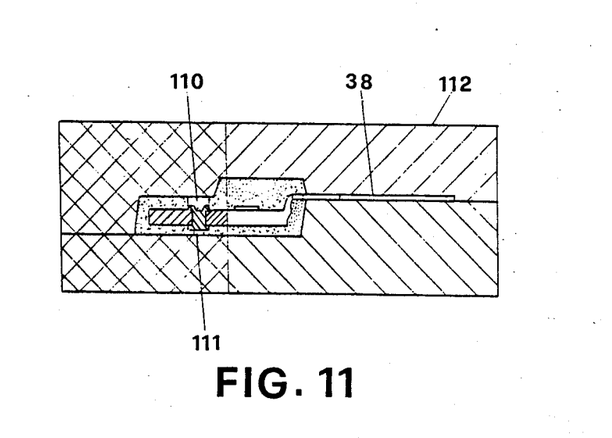
FIG. 11 shows a section displaying the position of the metallic plate (as shown in FIG. 10) in the mold used for encapsulation.

FIG. 9 is a sectional view of a plate after the aforesaid insertion of the nails (denoted by reference numeral 91) with the plane cutting the axis of holes 81. Just after the insertion of nails 91, the hot riveting of said nails begins according to diagram of FIG. 10, where the riveting rolls 101 of the riveting mold 102 are heated up to the plastic softening temperature of the nail, the said rolls having their ends so shaped as to give a prefixed riveting shape to the end of the nail. The final device encapsulation of the device, after the nails are riveted, is performed in mold 112 of transfer molding system shown in FIG. 11 (the figure shows the right sectional view of the mold referred to a plane cutting the axis of lead 38 and the left view according to a parallel plane crossing the axis of one of the two holes 81). The figure shows that the one side of the plate is clamped at a prefixed position in the mold by lead 38 connected thereto, whereas the other side is clamped by a pair of fixed pins 110 and 111 of the encapsulating mold, which are opposite to the nails ends.

Figure 12:
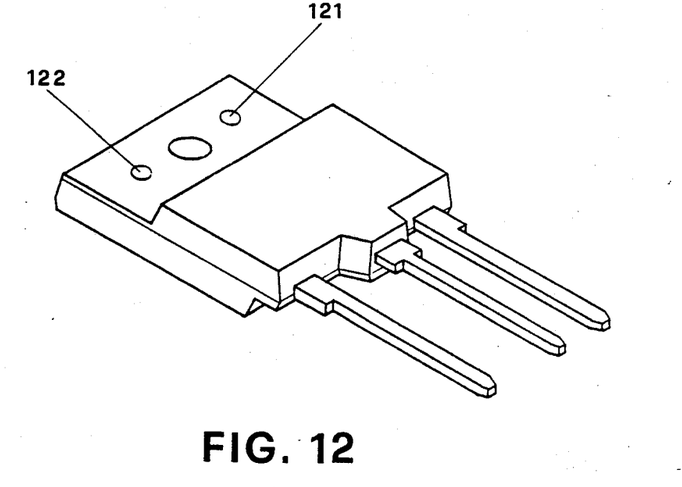
FIG. 12 shows a perspective view of a semiconductor device according to the preferred embodiment as shown in FIGS. 8-11, as it appears after the encapsulation.

FIG. 12 shows the formed semiconductor device where, due to the special method used for the correct position of the plate in the mold, all metallic parts are insulated, with the exception of the side from which the leads extend.

Accordingly, cavities 121, 122, corresponding to holes 81 of the plate (and the corresponding cavities on the other side of the housing) do not need to be successively sealed by plastic, since the inner plate is fully insulated by the head of the nails and by the plastic around the housing.

It is clear that the above described non-limiting embodiments are subject to changes, amendments and replacement of elements with other equivalent elements, remaining however in the scope of the following claims. In particular, even though the embodiments of the method have been described with reference to a single semiconductor chip soldered on the strip, the same method may be also applied in case of more semiconductor chips present on the same plate.

The same also applies to the number of leads extending from the housing device.

We claim:

1. A method for manufacturing a plastic encapsulated semiconductor device which comprises
    placing a semiconductor chip disposed on a metallic plate within a mold cavity, said metallic plate serving as both an electrode and as a heat sink, said metallic plate being provided at one end portion with a lead which extends from said mold cavity,
    providing retractable ejector pins from opposite sides of the mold cavity and into contact with the opposite sides of the other end portion of the metallic plate,
    introducing a polymerizable plastic material into mold cavity,
    withdrawing the ejector pins before the plastic material begins to polymerize,
    further introducing the polymerizable plastic material into the space vacated by the ejector pins, and
    removing the encapsulated semiconductor device from the mold cavity.

2. A method for manufacturing a plastic encapsulated semiconductor device which comprises:
    inserting a thermoplastic nail into at least one hole present in a plate supporting a semiconductor chip, said metallic plate serving as both an electrode and as a heat sink,
    riveting the ends of said thermoplastic nail to fix the nail to the metallic plate,
    placing said metallic plate and supported semiconductor chip within the cavity of a mold provided with at least a pair of clamping pins extending from opposite sides of the cavity and so located as to contact the opposite sides of said nail,
    introducing a polymerizable plastic material into the mold cavity, and
    removing the encapsulated semiconductor device from the mold cavity.

* * * * *

UNITED STATES PATENT AND TRADEMARK OFFICE
CERTIFICATE OF CORRECTION

PATENT NO. : 4,888,307
DATED : December 19, 1989
INVENTOR(S) : Antonio Perniciaro Spatrisano It is certified that error appears in the above-identified patent and that said Letters Patent is hereby corrected as shown below:

On the title page under item [19] "Spairisano" should be

--Perniciaro Spatrisano, et al--

In item [75] "Antonio P. Spairisano" should be --Antonio Perniciaro Spatrisano--

This certificate supersedes Certificate of Correction issued December 18, 1990.

Signed and Sealed this

Ninth Day of April, 1991

Attest:

HARRY F. MANBECK, JR.

Attesting Officer

Commissioner of Patents and Trademarks